United States Patent [19]
Ikeda

[11] Patent Number: 5,734,170
[45] Date of Patent: Mar. 31, 1998

[54] DRIVER FOR LIGHT EMITTING DEVICE

[75] Inventor: Masaharu Ikeda, Yokohama, Japan

[73] Assignee: Matsushita Electric Industrial Co., Ltd., Osaka, Japan

[21] Appl. No.: 718,002

[22] Filed: Sep. 13, 1996

[30] Foreign Application Priority Data

Sep. 29, 1995 [JP] Japan ................................. 7-252360

[51] Int. Cl.$^6$ ................................................. G02B 27/00
[52] U.S. Cl. ............................ 250/551; 250/205; 327/514
[58] Field of Search ......................... 250/205, 551, 250/214 R; 327/509, 514; 330/59

[56] References Cited

U.S. PATENT DOCUMENTS

| | | | |
|---|---|---|---|
| 3,772,514 | 11/1973 | Sunderland | 250/551 |
| 4,190,747 | 2/1980 | Feiner et al. | |
| 4,282,604 | 8/1981 | Jefferson | 250/551 |
| 4,652,764 | 3/1987 | Nagano | |
| 4,752,693 | 6/1988 | Nagano | |

FOREIGN PATENT DOCUMENTS

| | | |
|---|---|---|
| 0139210 | 5/1985 | European Pat. Off. |
| 2703866 | 10/1994 | France |
| 3411303 | 10/1984 | Germany |
| 1481815 | 8/1977 | United Kingdom |

OTHER PUBLICATIONS

"JFET doubles isolator's bandwidth" by Hageman, EDN Electrical Design News, 33, No. 24, Nov. 24, 1988, p. 225.

"Designing isolation amplifiers with the IL 300 optocoupler" by Krause et al, Siemens Components, vol. 27, No. 5, Sep. 1, 1992, pp. 28–32.

*Primary Examiner*—Stephone B. Allen
*Attorney, Agent, or Firm*—Pollock, Vande Sande & Priddy

[57] ABSTRACT

A light emitting device is operative for outputting a light beam having an intensity which increases as a drive current through the light emitting device increases. A power source is operative for supplying a drive current to the light emitting device. A control device connected to the power source and a first end of the light emitting device is operative for controlling the drive current to the light emitting device in response to an input signal. The control device has an input terminal subjected to the input signal. A photosensitive device is optically coupled to the light emitting device. A current flowing through the photosensitive device increases as an intensity of a light beam applied to the photosensitive device increases. The photosensitive device is connected between the input terminal of the control device and a second end of the light emitting device.

14 Claims, 6 Drawing Sheets

DRIVER FOR LIGHT EMITTING DEVICE

BACKGROUND OF THE INVENTION

1. Field of the Invention

This invention relates to a driver for a light emitting device such as a light emitting diode or a laser diode. This invention also relates to an isolated signal transmission apparatus including a driver for a light emitting device.

2. Description of the Prior Art

Generally, the optical power output of a laser diode or a light emitting diode varies in accordance with a change in the temperature and also the age thereof. Some of known drivers for light emitting devices are provided with feedback circuits each including a phototransistor or a photodiode to monitor the optical power output of the related light emitting device. The feedback circuit controls the light emitting device in response to the monitored optical power output so that the actual power output of the light emitting device will be maintained at a constant level independent of the temperature and the age thereof. Accordingly, the feedback circuit compensates for a variation in the optical power output of the light emitting device due to a change in the temperature or the age thereof.

An example of such known drivers includes a light emitting device, a photosensitive device, and a drive circuit. A light beam outputted from the light emitting device is divided into a main light beam and a sub light beam. The photosensitive device is subjected to the sub light beam, causing in electric current depending on the intensity of the sub light beam. The drive circuit controls a drive electric current to the light emitting device in response to the electric current caused by the photosensitive device. This control is designed so that the electric current caused by the photosensitive device will be maintained at a desired constant level independent of the temperature and the age of the light emitting device. Accordingly, the sub light beam is controlled at a desired power level. Also, the main light beam, which is proportional to the sub light beam in power, is controlled at a desired power level. Thus, it is possible to compensate for a variation in the optical power output of the light emitting device due to a change in the temperature or the age thereof.

A prior-art isolated signal transmission apparatus is provided with such a known driver. The prior-art isolated signal transmission apparatus includes a light emitting device, a main photosensitive device, a sub photosensitive device, and a drive circuit. The main photosensitive device and the sub photosensitive device are equal in characteristics. A light beam outputted from the light emitting device Is divided into a main light beam and a sub light beam applied to the main photosensitive device and the sub photosensitive device respectively. As in the previously-described known driver, the sub light beam and the main light beam are controlled at desired power levels independent of the temperature and the age of the light emitting device. A signal represented by the main light beam Is transmitted from a transmitter side including the light emitting device to a receiver side including the main photosensitive device. The transmitter side and the receiver side are optically coupled while being electrically isolated from each other.

SUMMARY OF THE INVENTION

It is an object of this invention to provide an improved driver for a light emitting device.

It is another object of this invention to provide an improved isolated signal transmission apparatus including a driver for a light emitting device.

A first aspect of this invention provides a driver for a light emitting device outputting a light beam having an intensity which increases as a drive current through the light emitting device increases, the driver comprising a power source for supplying a drive current to the light emitting device; a control device connected to the power source and a first end of the light emitting device for controlling the drive current to the light emitting device in response to an input signal, the control device having an input terminal subjected to the input signal; and a photosensitive device optically coupled to the light emitting device, wherein a current flowing through the photosensitive device increases as an intensity of a light beam applied to the photosensitive device increases, the photosensitive device being connected between the input terminal of the control device and a second end of the light emitting device.

A second aspect of this invention provides an isolated signal transmission apparatus comprising a light emitting device for outputting a light beam having in intensity which increases as a drive current through the light emitting device increases; a power source for supplying a drive current to the light emitting device; a control device connected to the power source and a first end of the light emitting device for controlling the drive current to the light emitting device in response to an input signal, the control device having an input terminal subjected to the input signal; a first photosensitive device optically coupled to the light emitting device, wherein a current flowing through the first photosensitive device increases as an intensity of a light beam applied to the first photosensitive device increases, the first photosensitive device being connected between the input terminal of the control device and a second end of the light emitting device; and a second photosensitive device optically coupled to the light emitting device, wherein a current flowing through the second photosensitive device increases as an intensity of a light beam applied to the second photosensitive device increases.

A third aspect of this invention provides an isolated signal transmission apparatus comprising a first light emitting device for outputting a light beam having an intensity which increases as a drive current through the first light emitting device increases; a second light emitting device for outputting a light beam having an intensity which increases as a drive current through second first light emitting device increases, the second light emitting device being connected in series with the first light emitting device; a power source for supplying a drive current to the series combination of the first and second light emitting devices; a control device connected to the power source and a first end of the series combination of the first and second light emitting devices for controlling the drive current to the series combination of the first and second light emitting devices in response to an input signal, the control device having an input terminal subjected to the input signal; a first photosensitive device optically coupled to the first light emitting device, wherein a current flowing through the first photosensitive device increases as an intensity of a light beam applied to the first photosensitive device increases, the first photosensitive device being connected between the input terminal of the control device and a second end of the series combination of the first and second light emitting devices; and a second photosensitive device optically coupled to the second light emitting device, wherein a current flowing through the second photosensitive device increases as an intensity of a light beam applied to the second photosensitive device increases.

A fourth aspect of this invention is based on the first aspect thereof, and provides a driver wherein the control device comprises an emitter follower including a transistor.

A fifth aspect of this invention is based on the second aspect thereof, and provides an isolated signal transmission apparatus wherein the control device comprises an emitter follower including a transistor.

A sixth aspect of this invention is based on the third aspect of this invention, and provides an isolated signal transmission apparatus wherein the control device comprises an emitter follower including a transistor.

A seventh aspect of this invention Is based on the first aspect thereof, and provides a driver wherein the control device comprises a source follower including a MOS transistor.

An eighth aspect of this invention is based on the second aspect thereof, and provides an isolated signal transmission apparatus wherein the control device comprises a source follower including a MOS transistor.

A ninth aspect of this invention is based on the third aspect thereof, and provides an isolated signal transmission apparatus wherein the control device comprises a source follower including a MOS transistor.

A tenth aspect of this invention is based on the first aspect thereof, and provides a driver further comprising a cascade transistor connected to the photosensitive device.

An eleventh aspect of this invention is based on the second aspect thereof, and provides an isolated signal transmission apparatus further comprising a cascade transistor connected to the second photosensitive device.

A twelfth aspect of this invention is based on the third aspect thereof, and provides an isolated signal transmission apparatus further comprising a cascade transistor connected to the second photosensitive device.

A thirteenth aspect of this invention is based on the second aspect thereof, and provides an isolated signal transmission apparatus further comprising means for equalizing a voltage across the first photosensitive device and a voltage across the second photosensitive device.

A fourteenth aspect of this invention Is based on the third aspect thereof, and provides an isolated signal transmission apparatus further comprising means for equalizing a voltage across the first photosensitive device and a voltage across the second photosensitive device.

DESCRIPTION OF THE PREFERRED EMBODIMENTS

A prior-art isolated signal transmission apparatus will be described hereinafter for a better understanding of this invention.

Figure 1:
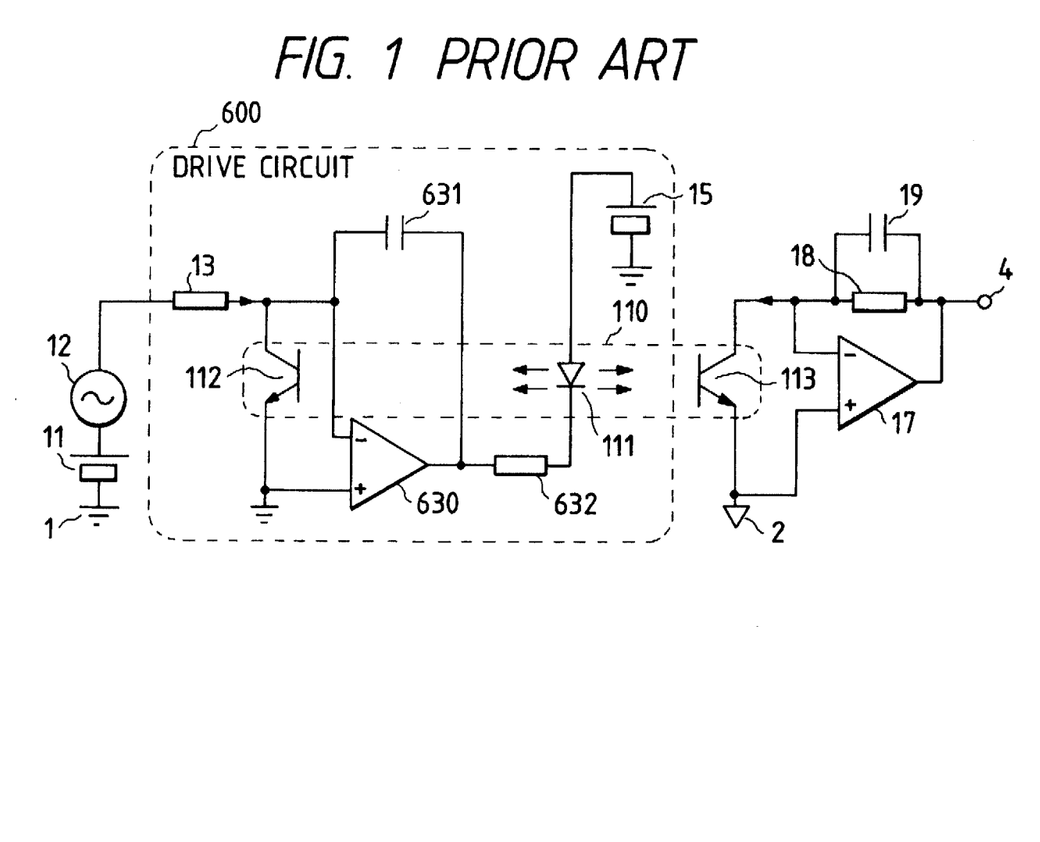
FIG. 1 is a diagram of a prior-art isolated signal transmission apparatus.

FIG. 1 shows a prior-art isolated signal transmission apparatus whose main part has an isolated amplifier including a photocoupler "CNR200" produced by Hewlett Packard.

With reference to FIG. 1, a transmitter side of the prior-art transmission apparatus has a first ground 1, a bias voltage source 11, a signal voltage source 12, a light emitting diode 111, and a drive circuit 600 for the light emitting diode 111.

The negative terminal of the bias voltage source 11 is connected to the first ground 1. The positive terminal of the bias voltage source 11 is connected via the signal voltage source 12 to the drive circuit 600. The drive circuit 600 is connected to the first ground 1. The light emitting diode 111 is electrically connected to the drive circuit 600.

In the prior-art transmission apparatus of FIG. 1, the drive circuit 600 includes a resistor 13, an operational amplifier 630, a capacitor 631, a resistor 632, and a voltage source 15. The drive circuit 600 also includes a part of a photocoupler 110. The photocoupler 110 has the light emitting diode 111 and phototransistors 112 and 113. The phototransistors 112 and 113 are optically coupled to the light emitting diode 111. Specifically, a light beam outputted from the light emitting diode 111 is divided into a sub light beam and a main light beam applied to the phototransistors 112 and 113 respectively. The phototransistors 112 and 113 are equal in characteristics.

One end of the resistor 13 is connected to the signal voltage source 12. The other end of the resistor 13 is connected to the inverting input terminal of the operational amplifier 630, and is connected to the first ground 1 via the collector-emitter path of the phototransistor 112. The non-inverting input terminal of the operational amplifier 630 is connected to the first ground 1. The capacitor 631 is connected between the inverting input terminal and the output terminal of the operational amplifier 630. The positive terminal of the voltage source 15 is connected to the output terminal of the operational amplifier 630 via the light emitting diode 111 and the resistor 632. The negative terminal of the voltage source 15 is connected to the first ground 1. The operational amplifier 630 is activated by a suitable dc power source (not shown).

A receiver side of the prior-art transmission apparatus of FIG. 1 includes a second ground 2, an operational amplifier 17, a resistor 18, a capacitor 19, and an output terminal 4. The receiver side also includes a part of the photocoupler 110. The ground 1 of the transmitter side and the ground 2 of the receiver side are isolated from each other.

The inverting input terminal of the operational amplifier 17 is connected to the second ground 2 via the collector-emitter path of the phototransistor 113. The non-inverting input terminal of the operational amplifier 17 is directly connected to the second ground 2. The resistor 18 is connected between the inverting input terminal and the output terminal of the operational amplifier 17. The capacitor 19 is also connected between the inverting input terminal and the output terminal of the operational amplifier 17. The operational amplifier 17 is followed by the output terminal 4. The operational amplifier 17 is activated by a suitable dc power source (not shown).

The prior-art transmission apparatus of FIG. 1 operates as follows. The signal voltage source 12 generates a voltage (a signal voltage) being a signal to be transmitted. The signal voltage is superimposed on a bias voltage generated by the bias voltage source 11. A combination of the signal voltage and the bias voltage is applied via the resistor 13 to the inverting input terminal of the operational amplifier 630. The signal voltage and the bias voltage are set so that the combination of the signal voltage and the bias voltage will remain positive as the signal voltage changes between its minimum level and its maximum level.

As the signal voltage rises, the voltage at the inverting input terminal of the operational amplifier 630 increases while the voltage at the output terminal of the operational amplifier 630 decreases. The decrease in the voltage at the output terminal of the operational amplifier 630 causes an increase in the voltage across the light emitting diode 111 and also an increase in the current flowing therethrough. As the current through the light emitting diode 111 increases, the intensity of the main light beam generated by the light emitting diode 111 increases. Thus, the phototransistor 113 in the receiver side is subjected to the main light beam having an increased intensity. As the intensity of the main light beam increases, the current flowing through the phototransistor 113 increases. The increase in the current through the phototransistor 113 causes a decrease in the voltage at the inverting input terminal of the operational amplifier 17. The resistor 18 enables such a decrease in the voltage at the inverting input terminal of the operational amplifier 17. As the voltage at the inverting input terminal of the operational amplifier 17 decreases, the voltage at the output terminal of the operational amplifier 17 increases. Therefore, the voltage at the output terminal of the operational amplifier 17, that is, the voltage at the output terminal 4, increases in accordance with a rise in the signal voltage.

As the signal voltage drops, the voltage at the inverting input terminal of the operational amplifier 630 decreases while the voltage at the output terminal of the operational amplifier 630 increases. The increase in the voltage at the output terminal of the operational amplifier 630 causes a decrease in the voltage across the light emitting diode 111 and also a decrease in the current flowing therethrough. As the current through the light emitting diode 111 decreases, the intensity of the main light beam generated by the light emitting diode 111 decreases. Thus, the phototransistor 113 in the receiver side is subjected to the main light beam having a decreased intensity. As the intensity of the main light beam decreases, the current flowing through the phototransistor 113 decreases. The decrease in the current through the phototransistor 113 causes an increase in the voltage at the inverting input terminal of the operational amplifier 17. The resistor 18 enables such an increase in the voltage at the inverting input terminal of the operational amplifier 17. As the voltage at the inverting input terminal of the operational amplifier 17 increases, the voltage at the output terminal of the operational amplifier 17 decreases. Therefore, the voltage at the output terminal of the operational amplifier 17, that is, the voltage at the output terminal 4, decreases in accordance with a drop in the signal voltage.

As previously described, the voltage at the output terminal 4 in the receiver side increases and decreases in accordance with an increase and a decrease in the signal voltage in the transmitter side. Thus, in the prior-art transmission apparatus of FIG. 1, the signal voltage is transmitted from the transmitter side to the receiver side. The ground 1 of the transmitter side and the ground 2 of the receiver side are isolated from each other. A power source in the transmitter side and a power source in the receiver side are separate from each other. Accordingly, the transmitter side and the receiver side are electrically isolated from each other.

It is now assumed that the characteristics of the light emitting diode 111 vary and hence the optical power output thereof decreases in accordance with a change in the temperature or the age thereof. As the optical power output of the light emitting diode 111 decreases, the intensity of the sub light beam generated by the light emitting diode 111 decreases. Thus, the phototransistor 112 Is subjected to the sub light beam having a decreased intensity. As the intensity of the sub light beam decreases, the current flowing through the phototransistor 112 decreases. The decrease in the current through the phototransistor 112 causes an increase in the voltage at the inverting input terminal of the operational amplifier 630. The resistor 13 enables such an increase in the voltage at the inverting input terminal of the operational amplifier 630. As the voltage at the inverting input terminal of the operational amplifier 630 increases, the voltage at the output terminal of the operational amplifier 630 decreases. The decrease in the voltage at the output terminal of the operational amplifier 630 causes an increase in the voltage across the light emitting diode 111 and also an increase in the current flowing therethrough. As the current through the light emitting diode 111 increases, the optical power output of the light emitting diode 111 increases. Thus, it is possible to compensate for a decrease in the optical power output of the light emitting diode 111 due to a change in the temperature or the age thereof.

It is now assumed that the characteristics of the light emitting diode 111 vary and hence the optical power output thereof increases in accordance with a change in the temperature thereof. As the optical power output of the light emitting diode 111 increases, the intensity of the sub light beam generated by the light emitting diode 111 increases. Thus, the phototransistor 112 is subjected to the sub light beam having an increased intensity. As the intensity of the sub light beam increases, the current flowing through the phototransistor 112 increases. The increase in the current through the phototransistor 112 causes a decrease in the voltage at the inverting input terminal of the operational amplifier 630. The resistor 13 enables such a decrease in the voltage at the inverting input terminal of the operational amplifier 630. As the voltage at the inverting input terminal of the operational amplifier 630 decreases, the voltage at the output terminal of the operational amplifier 630 increases. The increase in the voltage at the output terminal of the operational amplifier 630 causes a decrease in the voltage across the light emitting diode 111 and also a decrease in the current flowing therethrough. As the current through the light emitting diode 111 decreases, the optical power output of the light emitting diode 111 decreases. Thus, it is possible to compensate for an increase in the optical power output of the light emitting diode 111 due to a change in the temperature thereof.

In the prior-art transmission apparatus of FIG. 1, the capacitor 631 adjusts the phase of the signal processed by the operational amplifier 630 to stabilize a negative feedback process implemented thereby. In addition, the capacitor 19 adjusts the phase of the signal processed by the operational amplifier 17 to stabilize a negative feedback process implemented thereby.

First Embodiment

Figure 2:
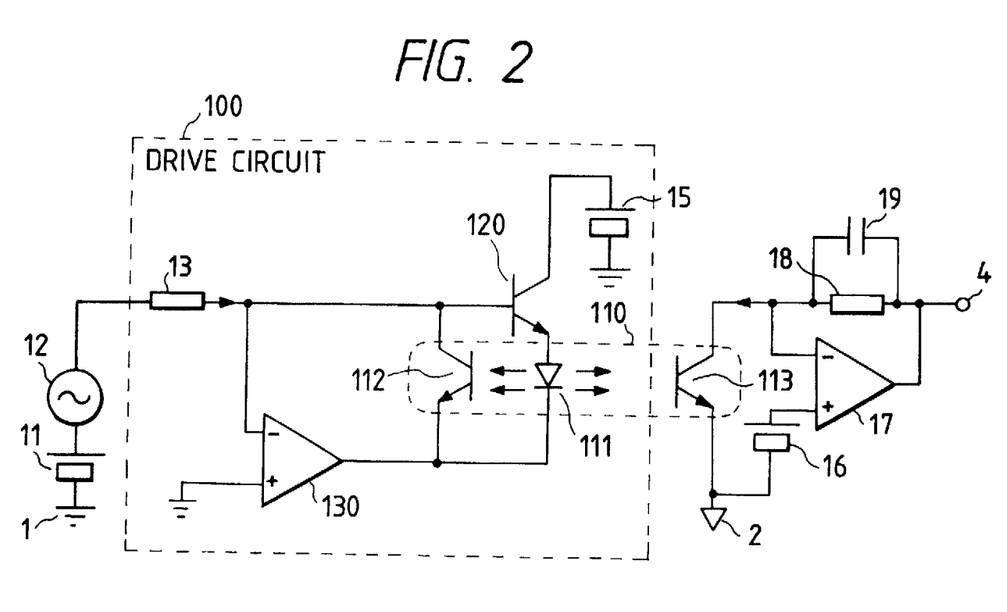
FIG. 2 is a diagram of an isolated signal transmission apparatus according to a first embodiment of this invention.

FIG. 2 shows an isolated signal transmission apparatus according to a first embodiment of this invention.

With reference to FIG. 2, a transmitter side of the transmission apparatus has a first ground 1, a bias voltage source 11, a signal voltage source 12, a light emitting diode 111, and a drive circuit 100 for the light emitting diode 111.

The negative terminal of the bias voltage source 11 is connected to the first ground 1. The positive terminal of the bias voltage source 11 is connected via the signal voltage source 12 to the drive circuit 100. The drive circuit 100 is connected to the first ground 1. The light emitting diode 111 is electrically connected to the drive circuit 100.

In the transmission apparatus of FIG. 2, the drive circuit 100 includes a resistor 13, an NPN transistor 120, an operational amplifier 130, and a voltage source 15. The drive circuit 100 also includes a part of a photocoupler 110. The photocoupler 110 has the light emitting diode 111 and NPN phototransistors 112 and 113. The phototransistors 112 and 113 are optically coupled to the light emitting diode 111. Specifically, a light beam outputted from the light emitting diode 111 is divided into a sub light beam and a main light beam applied to the phototransistors 112 and 113 respectively. It is preferable that the phototransistors 112 and 113 are equal in characteristics.

One end of the resistor 13 is connected to the signal voltage source 12. The other end of the resistor 13 is connected to the inverting input terminal of the operational amplifier 130, the collector of the phototransistor 112, and the base of the transistor 120. The non-inverting input terminal of the operational amplifier 130 is connected to the first ground 1. The emitter of the phototransistor 112 is connected to the output terminal of the operational amplifier 130. The positive terminal of the voltage source 15 is connected to the collector of the transistor 120. The negative terminal of the voltage source 15 is connected to the first ground 1. The emitter of the transistor 120 is connected via the light emitting diode 111 to the output terminal of the operational amplifier 130. The operational amplifier 130 is activated by a suitable dc power source (not shown).

A receiver side of the transmission apparatus of FIG. 2 includes a second ground 2, a bias voltage source 16, an operational amplifier 17, a resistor 18, a capacitor 19, and an output terminal 4. The receiver side also includes a part of the photocoupler 110. The ground 1 of the transmitter side and the ground 2 of the receiver side are isolated from each other.

The inverting input terminal of the operational amplifier 17 is connected to the second ground 2 via the collector-emitter path of the phototransistor 113. The non-inverting input terminal of the operational amplifier 17 is connected to the positive terminal of the bias voltage source 16. The negative terminal of the bias voltage source 16 is connected to the second ground 2. The resistor 18 is connected between the inverting input terminal and the output terminal of the operational amplifier 17. The capacitor 19 is also connected between the inverting input terminal and the output terminal of the operational amplifier 17. The operational amplifier 17 is followed by the output terminal 4. The operational amplifier 17 is activated by a suitable dc power source (not shown).

The transmission apparatus of FIG. 2 operates as follows. The signal voltage source 12 generates a voltage (a signal voltage) being a signal to be transmitted. The signal voltage is superimposed on a bias voltage generated by the bias voltage source 11. A combination of the signal voltage and the bias voltage is applied via the resistor 13 to the inverting input terminal of the operational amplifier 130 and the base of the transistor 120. The signal voltage and the bias voltage are set so that the combination of the signal voltage and the bias voltage will remain positive as the signal voltage changes between its minimum level and its maximum level.

As the signal voltage rises, the voltage at the inverting input terminal of the operational amplifier 130 increases while the voltage at the output terminal of the operational amplifier 130 decreases. In addition, the voltage at the base of the transistor 120 increases. The decrease in the voltage at the output terminal of the operational amplifier 130 and the increase in the voltage at the base of the transistor 120 cause an increase in the voltage across the light emitting diode 111 and also an increase in the current flowing therethrough. As the current through the light emitting diode 111 increases, the intensity of the main light beam generated by the light emitting diode 111 increases. Thus, the phototransistor 113 in the receiver side is subjected to the main light beam having an increased intensity. As the intensity of the main light beam increases, the current flowing through the phototransistor 113 increases. The increase in the current through the phototransistor 113 causes a decrease in the voltage at the inverting input terminal of the operational amplifier 17. The resistor 18 enables such a decrease in the voltage at the inverting input terminal of the operational amplifier 17. As the voltage at the inverting input terminal of the operational amplifier 17 decreases, the voltage at the output terminal of the operational amplifier 17 increases. Therefore, the voltage at the output terminal of the operational amplifier 17, that is, the voltage at the output terminal 4, increases in accordance with a rise in the signal voltage.

As the signal voltage drops, the voltage at the inverting input terminal of the operational amplifier 130 decreases while the voltage at the output terminal of the operational amplifier 130 increases. In addition, the voltage at the base of the transistor 120 decreases. The increase in the voltage at the output terminal of the operational amplifier 130 and the decrease in the voltage at the base of the transistor 120 cause a decrease in the voltage across the light emitting diode 111 and also a decrease in the current flowing therethrough. As the current through the light emitting diode 111 decreases, the intensity of the main light beam generated by the light emitting diode 111 decreases. Thus, the phototransistor 113 in the receiver side is subjected to the main light beam having a decreased intensity. As the intensity of the main light beam decreases, the current flowing through the phototransistor 113 decreases. The decrease in the current through the phototransistor 113 causes an increase in the voltage at the inverting input terminal of the operational amplifier 17. The resistor 18 enables such an increase in the voltage at the inverting input terminal of the operational amplifier 17. As the voltage at the inverting input terminal of the operational amplifier 17 increases, the voltage at the output terminal of the operational amplifier 17 decreases. Therefore, the voltage at the output terminal of the operational amplifier 17, that is, the voltage at the output terminal 4, decreases in accordance with a drop in the signal voltage.

As previously described, the voltage at the output terminal 4 in the receiver side increases and decreases in accordance with an increase and a decrease in the signal voltage in the transmitter side. Thus, in the transmission apparatus of FIG. 2, the signal voltage is transmitted from the transmitter side to the receiver side. The ground 1 of the transmitter side and the ground 2 of the receiver side are isolated from each other. A power source in the transmitter side and a power source in the receiver side are separate from each other. Accordingly, the transmitter side and the receiver side are electrically isolated from each other.

It is now assumed that the characteristics of the light emitting diode 111 vary and hence the optical power output thereof decreases in accordance with a change in the temperature or the age thereof. As the optical power output of the light emitting diode 111 decreases, the intensity of the sub light beam generated by the light emitting diode 111 decreases. Thus, the phototransistor 112 is subjected to the sub light beam having a decreased intensity. As the intensity of the sub light beam decreases, the current flowing through the phototransistor 112 decreases. The decrease in the current through the phototransistor 112 causes an increase in the voltage at the inverting input terminal of the operational amplifier 130 and also an increase in the voltage at the base of the transistor 120. The resistor 13 enables such an increase in the voltage at the inverting input terminal of the operational amplifier 130. As the voltage at the inverting input terminal of the operational amplifier 130 increases, the voltage at the output terminal of the operational amplifier 130 decreases. The decrease in the voltage at the output terminal of the operational amplifier 130 and the increase in the voltage at the base of the transistor 120 cause an increase in the voltage across the light emitting diode 111 and also an increase in the current flowing therethrough. As the current through the light emitting diode 111 increases, the optical power output of the light emitting diode 111 increases. Thus, it is possible to compensate for a decrease in the optical power output of the light emitting diode 111 due to a change in the temperature or the age thereof.

It is now assumed that the characteristics of the light emitting diode 111 vary and hence the optical power output thereof increases in accordance with a change in the temperature thereof. As the optical power output of the light emitting diode 111 increases, the intensity of the sub light beam generated by the light emitting diode 111 increases. Thus, the phototransistor 112 is subjected to the sub light beam having an increased intensity. As the intensity of the sub light beam increases, the current flowing through the phototransistor 112 increases. The increase in the current through the phototransistor 112 causes a decrease in the voltage at the inverting input terminal of the operational amplifier 130 and also a decrease in the voltage at the base of the transistor 120. The resistor 13 enables such a decrease in the voltage at the inverting input terminal of the operational amplifier 130. As the voltage at the inverting input terminal of the operational amplifier 130 decreases, the voltage at the output terminal of the operational amplifier 130 increases. The increase in the voltage at the output terminal of the operational amplifier 130 and the decrease in the voltage at the base of the transistor 120 cause a decrease in the voltage across the light emitting diode 111 and also a decrease in the current flowing therethrough. As the current through the light emitting diode 111 decreases, the optical power output of the light emitting diode 111 decreases. Thus, it is possible to compensate for an increase in the optical power output of the light emitting diode 111 due to a change in the temperature thereof.

In the transmission apparatus of FIG. 2, the capacitor 19 adjusts the phase of the signal processed by the operational amplifier 17 to stabilize a negative feedback process implemented thereby. Generally, the bias voltage source 16 is designed to equalize the collector-emitter voltages of the phototransistors 112 and 113.

The transmission apparatus of FIG. 2 is advantageous over the prior-art transmission apparatus of FIG. 1 as follows. In the transmission apparatus of FIG. 2, the light emitting diode 111 is connected to the signal voltage source 12 via the resistor 13 and the transistor 120. In the prior-art transmission apparatus of FIG. 1, the light emitting diode 111 is connected to the signal voltage source 12 via the resistor 13, the operational amplifier 630, the capacitor 631, and the resistor 632. The operational amplifier 630 and the capacitor 631 are connected to implement a negative feedback process. Accordingly, the transmission apparatus of FIG. 2 has a higher speed of a response of the current through the light emitting diode 111 to a change in the signal voltage than the speed available in the prior-art transmission apparatus of FIG. 1.

Second Embodiment

Figure 3:
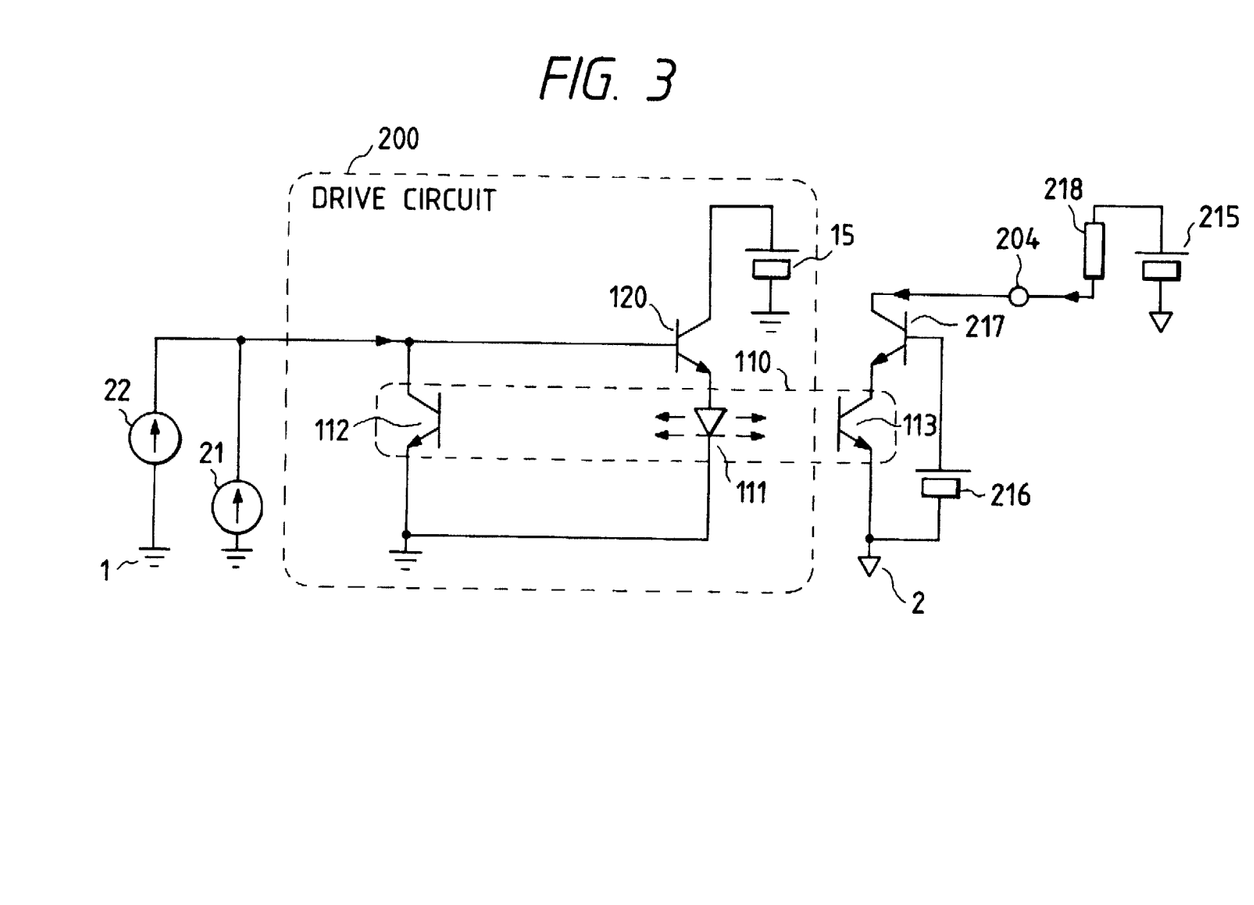
FIG. 3 is a diagram of an isolated signal transmission apparatus according to a second embodiment of this invention.

FIG. 3 shows an isolated signal transmission apparatus according to a second embodiment of this invention.

With reference to FIG. 3, a transmitter side of the transmission apparatus has a first ground 1, a bias current source 21, a signal current source 22, a light emitting diode 111, and a drive circuit 200 for the light emitting diode 111.

The negative terminal of the bias current source 21 is connected to the first ground 1. The positive terminal of the bias current source 21 is connected to the drive circuit 200. The negative terminal of the signal current source 22 is connected to the first ground 1. The positive terminal of the signal current source 22 is connected to the drive circuit 200. The positive terminals of the bias current source 21 and the signal current source 22 are connected to each other. The drive circuit 200 is connected to the first ground 1. The light emitting diode 111 is electrically connected to the drive circuit 200.

In the transmission apparatus of FIG. 3, the drive circuit 200 includes an NPN transistor 120 and a voltage source 15. The drive circuit 200 also includes a part of a photocoupler 110. The photocoupler 110 has the light emitting diode 111 and NPN phototransistors 112 and 113. The phototransistors 112 and 113 are optically coupled to the light emitting diode 111. Specifically, a light beam outputted from the light emitting diode 111 is divided into a sub light beam and a main light beam applied to the phototransistors 112 and 113 respectively. It is preferable that the phototransistors 112 and 113 are equal in characteristics.

The base of the transistor 120 is connected to the positive terminals of the bias current source 21 and the signal current source 22. The positive terminal of the voltage source 15 is connected to the collector of the transistor 120. The negative terminal of the voltage source 15 is connected to the first ground 1. The emitter of the transistor 120 is connected via the light emitting diode 111 to the first ground 1. The collector of the phototransistor 112 is connected to the positive terminals of the bias current source 21 and the signal current source 22. The emitter of the phototransistor 112 is connected to the first ground 1.

A receiver side of the transmission apparatus of FIG. 3 includes a second ground 2, a bias voltage source 216, an NPN transistor 217, a load 218, a voltage source 215, and an output terminal 204. The receiver side also includes a part of the photocoupler 110. The ground 1 of the transmitter side and the ground 2 of the receiver side are isolated from each other.

The positive terminal of the bias voltage source 216 is connected to the base of the transistor 217. The negative terminal of the bias voltage source 216 is connected to the second ground 2. The emitter of the transistor 217 is connected to the collector of the phototransistor 113. The emitter of the phototransistor 113 is connected to the second ground 2. The collector of the transistor 217 is connected to the positive terminal of the voltage source 215 via the output terminal 204 and the load 218. The negative terminal of the voltage source 215 is connected to the second ground 2.

The transmission apparatus of FIG. 3 operates as follows. The signal current source 22 generates a current (a signal current) being a signal to be transmitted. The signal current is superimposed on a bias current generated by the bias current source 21. A combination of the signal current and the bias current flows into the drive circuit 200.

As the signal current increases, the base current of the transistor 120 increases so that a greater current flows from the voltage source 15 into the light emitting diode 111 via the transistor 120. As the current through the light emitting diode 111 increases, the intensity of the main light beam generated by the light emitting diode 111 increases. Thus, the phototransistor 113 in the receiver side is subjected to the main light beam having an increased intensity. As the intensity of the main light beam increases, a greater current flows from the voltage source 215 into the phototransistor 113 via the load 218, the output terminal 204, and the transistor 217. Thus, the current flowing through the load 218 and the output terminal 204 increases in accordance with an increase in the signal current.

As the signal current decreases, the base current of the transistor 120 decreases so that a smaller current flows from the voltage source 15 into the light emitting diode 111 via the transistor 120. As the current through the light emitting diode 111 decreases, the intensity of the main light beam generated by the light emitting diode 111 decreases. Thus, the phototransistor 113 in the receiver side is subjected to the main light beam having a decreased intensity. As the intensity of the main light beam decreases, a smaller current flows from the voltage source 215 into the phototransistor 113 via the load 218, the output terminal 204, and the transistor 217. Thus, the current flowing through the load 218 and the output terminal 204 decreases in accordance with a decrease in the signal current.

As previously described, the current through the output terminal 204 in the receiver side increases and decreases in accordance with an increase and a decrease in the signal current in the transmitter side. Thus, in the transmission apparatus of FIG. 3, the signal current is transmitted from the transmitter side to the receiver side. The ground 1 of the transmitter side and the ground 2 of the receiver side are isolated from each other. The power sources in the transmitter side and the power sources in the receiver side are separate from each other. Accordingly, the transmitter side and the receiver side are electrically isolated from each other.

It is now assumed that the characteristics of the light emitting diode 111 vary and hence the optical power output thereof decreases in accordance with a change in the temperature or the age thereof. As the optical power output of the light emitting diode 111 decreases, the intensity of the sub light beam generated by the light emitting diode 111 decreases. Thus, the phototransistor 112 is subjected to the sub light beam having a decreased intensity. As the intensity of the sub light beam decreases, the current flowing through the phototransistor 112 decreases. The decrease in the current through the phototransistors 112 causes an increase in the base current of the transistor 120 and also an increase in the current through the light emitting diode 111. As the current through the light emitting diode 111 increases, the optical power output of the light emitting diode 111 increases. Thus, it is possible to compensate for a decrease in the optical power output of the light emitting diode 111 due to a change in the temperature or the age thereof.

It is now assumed that the characteristics of the light emitting diode 111 vary and hence the optical power output thereof increases in accordance with a change in the temperature thereof. As the optical power output of the light emitting diode 111 increases, the intensity of the sub light beam generated by the light emitting diode 111 increases. Thus, the phototransistor 112 is subjected to the sub light beam having an increased intensity. As the intensity of the sub light beam increases, the current flowing through the phototransistor 112 increases. The increase in the current through the phototransistor 112 causes a decrease in the base current of the transistor 120 and also a decrease in the current through the light emitting diode 111. As the current through the light emitting diode 111 decreases, the optical power output of the light emitting diode 111 decreases. Thus, it is possible to compensate for an increase in the optical power output of the light emitting diode 111 due to a change in the temperature-thereof.

In the transmission apparatus of FIG. 3, the bias voltage source 216 is designed to equalize the collector-emitter voltages of the phototransistors 112 and 113.

The transmission apparatus of FIG. 3 is advantageous as follows. In the transmission apparatus of FIG. 3, the light emitting diode 111 is connected to the signal current source 22 via the transistor 120 only. Accordingly, the transmission apparatus of FIG. 3 has a high speed of a response of the current through the light emitting diode 111 to a change in the signal current.

Third Embodiment

Figure 4:
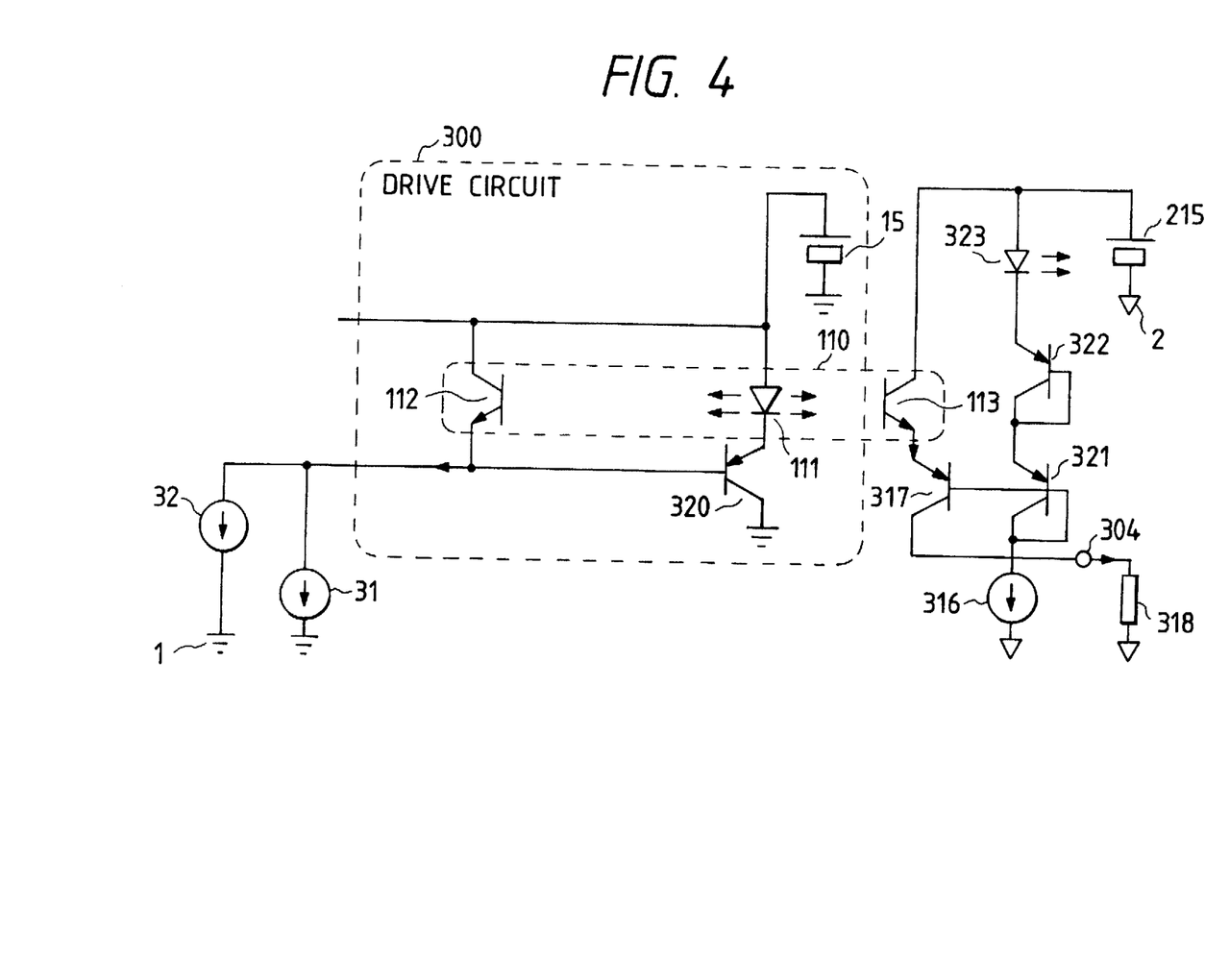
FIG. 4 is a diagram of an isolated signal transmission apparatus according to a third embodiment of this invention.

FIG. 4 shows an isolated signal transmission apparatus according to a third embodiment of this invention.

With reference to FIG. 4, a transmitter side of the transmission apparatus has a first ground 1, a bias current source 31, a signal current source 32, a light emitting diode 111, and a drive circuit 300 for the light emitting diode 111.

The positive terminal of the bias current source 31 is connected to the first ground 1. The negative terminal of the bias current source 31 is connected to the drive circuit 300. The positive terminal of the signal current source 32 is connected to the first ground 1. The negative terminal of the signal current source 32 is connected to the drive circuit 300. The negative terminals of the bias current source 31 and the signal current source 32 are connected to each other. The drive circuit 300 is connected to the first ground 1. The light emitting diode 111 is electrically connected to the drive circuit 300.

In the transmission apparatus of FIG. 4, the drive circuit 300 includes a PNP transistor 320 and a voltage source 15. The drive circuit 300 also includes a part of a photocoupler 110. The photocoupler 110 has the light emitting diode 111 and NPN phototransistors 112 and 113. The phototransistors 112 and 113 are optically coupled to the light emitting diode 111. Specifically, a light beam outputted from the light emitting diode 111 is divided into a sub light beam and a main light beam applied to the phototransistors 112 and 113 respectively. It is preferable that the phototransistors 112 and 113 are equal in characteristics.

The base of the transistor 320 is connected to the negative terminals of the bias current source 31 and the signal current source 32. The positive terminal of the voltage source 15 is connected via the light emitting diode 111 to the emitter of the transistor 320. The negative terminal of the voltage source 15 is connected to the first ground 1. The collector of the transistor 320 is connected to the first ground 1. The collector of the phototransistor 112 is connected to the positive terminal of the voltage source 15. The emitter of the phototransistor 112 is connected to the negative terminals of the bias current source 31 and the signal current source 32.

A receiver side of the transmission apparatus of FIG. 4 includes a second ground 2, a current source 316, PNP transistors 317, 321, and 322, a light emitting diode 323, a load 318, a voltage source 215, and an output terminal 304. The receiver side also includes a part of the photocoupler 110. The ground 1 of the transmitter side and the ground 2 of the receiver side are isolated from each other.

The positive terminal of the current source 316 is connected to the second ground 2. The negative terminal of the current source 316 is connected to the collector of the transistor 821, the base of the transistor 321, and the base of the transistor 317. The emitter of the transistor 321 is connected to the collector and the base of the transistor 322. The emitter of the transistor 322 is connected via the light emitting diode 323 to the positive terminal of the voltage source 215. The negative terminal of the voltage source 215 is connected to the second ground 2. The positive terminal of the voltage source 215 is connected to the collector of the phototransistor 113. The emitter of the phototransistor 113 is connected to the emitter of the transistor 317. The collector of the transistor 317 is connected to the second ground 2 via the output terminal 304 and the load 318.

The transmission apparatus of FIG. 4 operates as follows. The signal current source 32 generates a current (a signal current) being a signal to be transmitted. The signal current is superimposed on a bias current generated by the bias current source 31. A combination of the signal current and the bias current flows into the drive circuit 300.

As the signal current increases, the base current of the transistor 320 increases so that a greater current caused by the voltage source 15 flows through the light emitting diode 111 and the emitter-collector path of the transistor 320. As the current through the light emitting diode 111 increases, the intensity of the main light beam generated by the light emitting diode 111 increases. Thus, the phototransistor 113 in the receiver side is subjected to the main light beam having an increased intensity. As the intensity of the main light beam increases, a greater current caused by the voltage source 215 flows through the phototransistor 113, the emitter-collector path of the transistor 317, the output terminal 304, and the load 318. Thus, the current flowing through the output terminal 304 and the load 318 increases in accordance with an increase in the signal current.

As the signal current decreases, the base current of the transistor 320 decreases so that a smaller current caused by the voltage source 15 flows through the light emitting diode 111 and the emitter-collector path of the transistor 320. As the current through the light emitting diode 111 decreases, the intensity of the main light beam generated by the light emitting diode 111 decreases. Thus, the phototransistor 113 in the receiver side is subjected to the main light beam having a decreased intensity. As the intensity of the main light beam decreases, a smaller current caused by the voltage source 215 flows through the phototransistor 113, the emitter-collector path of the transistor 317, the output terminal 304, and the load 318. Thus, the current flowing through the output terminal 304 and the load 318 decreases in accordance with a decrease in the signal current.

As previously described, the current through the output terminal 304 in the receiver side increases and decreases in accordance with an increase and a decrease in the signal current in the transmitter side. Thus, in the transmission apparatus of FIG. 4, the signal current is transmitted from the transmitter side to the receiver side. The ground 1 of the transmitter side and the ground 2 of the receiver side are isolated from each other. The power sources in the transmitter side and the power sources in the receiver side are separate from each other. Accordingly, the transmitter side and the receiver side are electrically isolated from each other.

It is now assumed that the characteristics of the light emitting diode 111 vary and hence the optical power output thereof decreases in accordance with a change in the temperature or the age thereof. As the optical power output of the light emitting diode 111 decreases, the intensity of the sub light beam generated by the light emitting diode 111 decreases. Thus, the phototransistor 112 is subjected to the sub light beam having a decreased intensity. As the intensity of the sub light beam decreases, the current flowing through the phototransistor 112 decreases. The decrease in the current through the phototransistor 112 causes an increase in the base current of the transistor 320 and also an increase in the current through the light emitting diode 111. As the current through the light emitting diode 111 increases, the optical power output of the light emitting diode 111 increases. Thus, it is possible to compensate for a decrease in the optical power output of the light emitting diode 111 due to a change in the temperature or the age thereof.

It is now assumed that the characteristics of the light emitting diode 111 vary and hence the optical power output thereof increases in accordance with a change in the temperature thereof. As the optical power output of the light emitting diode 111 increases, the intensity of the sub light beam generated by the light emitting diode 111 increases. Thus, the phototransistor 112 is subjected to the sub light beam having an increased intensity. As the intensity of the sub light beam increases, the current flowing through the phototransistor 112 increases. The increase in the current through the phototransistor 112 causes a decrease in the base current of the transistor 320 and also a decrease in the current through the light emitting diode 111. As the current through the light emitting diode 111 decreases, the optical power output of the light emitting diode 111 decreases. Thus, it is possible to compensate for an increase in the optical power output of the light emitting diode 111 due to a change in the temperature thereof.

In the transmission apparatus of FIG. 4, the combination of the transistors 321 and 322, the light emitting diode 323, and the current source 316 provides a bias voltage chosen to equalize the collector-emitter voltages of the phototransistors 112 and 113. Specifically, the collector-emitter voltage of the phototransistor 112 is equal to the sum of the normal-direction voltage across the light emitting diode 111 and the base-emitter voltage of the transistor 320. The collector-emitter voltage of the phototransistor 113 is equal to the result of subtracting the base-emitter voltage of the transistor 317 from the sum of the normal-direction voltage of the light emitting diode 323, the base-emitter voltage of the transistor 321, and the base-emitter voltage of the transistor 322.

The transmission apparatus of FIG. 4 has an advantage similar to the advantage of the transmission apparatus of FIG. 3.

Fourth Embodiment

Figure 5:
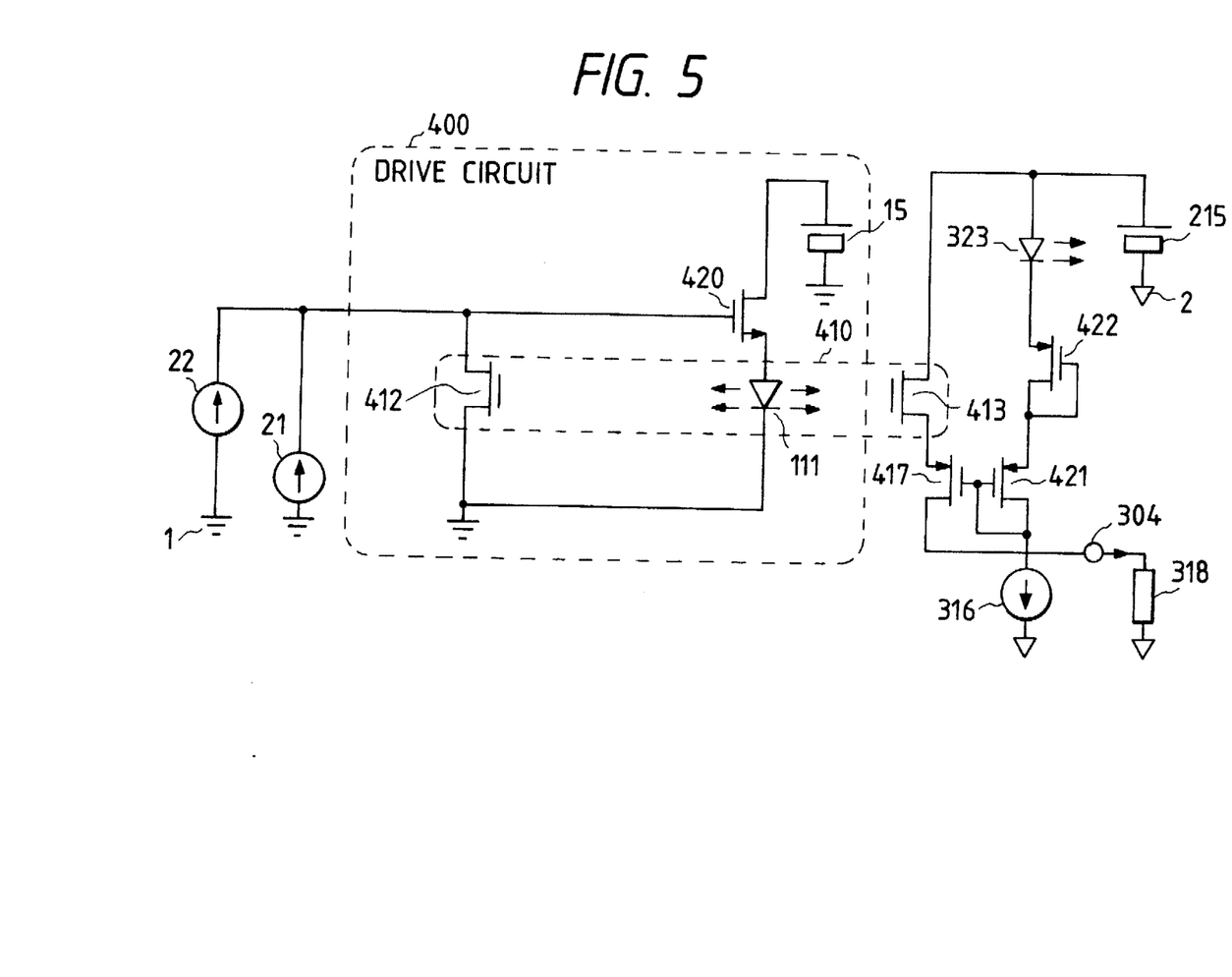
FIG. 5 is a diagram of an isolated signal transmission apparatus according to a fourth embodiment of this invention.

FIG. 5 shows an isolated signal transmission apparatus according to a fourth embodiment of this invention.

With reference to FIG. 5, a transmitter side of the transmission apparatus has a first ground 1, a bias current source 21, a signal current source 22, a light emitting diode 111, and a drive circuit 400 for the light emitting diode 111.

The negative terminal of the bias current source 21 is connected to the first ground 1. The positive terminal of the bias current source 21 is connected to the drive circuit 400. The negative terminal of the signal current source 22 is connected to the first ground 1. The positive terminal of the signal current source 22 is connected to the drive circuit 400. The positive terminals of the bias current source 21 and the signal current source 22 are connected to each other. The drive circuit 400 is connected to the first ground 1. The light emitting diode 111 is electrically connected to the drive circuit 400.

In the transmission apparatus of FIG. 5, the drive circuit 400 includes an n-channel MOS transistor 420 and a voltage source 15. The drive circuit 400 also includes a part of a photocoupler 410. The photocoupler 410 has the light emitting diode 111 and MOS phototransistors 412 and 413. The phototransistors 412 and 413 are optically coupled to the light emitting diode 111. Specifically, a light beam outputted from the light emitting diode 111 is divided into a sub light beam and a main light beam applied to the phototransistors 412 and 413 respectively. It is preferable that the phototransistors 412 and 413 are equal in characteristics.

The gate of the transistor 420 is connected to the positive terminals of the bias current source 21 and the signal current source 22. The positive terminal of the voltage source 15 is connected to the drain of the transistor 420. The negative terminal of the voltage source 15 is connected to the first ground 1. The source of the transistor 420 is connected via the light emitting diode 111 to the first ground 1. The drain of the phototransistor 412 is connected to the positive terminals of the bias current source 21 and the signal current source 22. The source of the phototransistor 412 is connected to the first ground 1.

A receiver side of the transmission apparatus of FIG. 5 includes a second ground 2, a current source 316, p-channel MOS transistors 417, 421, and 422, a light emitting diode 323, a load 318, a voltage source 215, and an output terminal 304. The receiver side also includes a part of the photocoupler 410. The ground 1 of the transmitter side and the ground 2 of the receiver side are isolated from each other.

The positive terminal of the current source 316 is connected to the second ground 2. The negative terminal of the current source 3 16 is connected to the drain of the transistor 421, the gate of the transistor 421, and the gate of the transistor 417. The source of the transistor 421 is connected to the drain and the gate of the transistor 422. The source of the transistor 422 is connected via the light emitting diode 323 to the positive terminal of the voltage source 215. The negative terminal of the voltage source 215 is connected to the second ground 2. The positive terminal of the voltage source 215 is connected to the drain of the phototransistor 413. The source of the phototransistor 413 is connected to the source of the transistor 417. The drain of the transistor 417 is connected to the second ground 2 via the output terminal 304 and the load 318.

The transmission apparatus of FIG. 5 operates as follows. The signal current source 22 generates a current (a signal current) being a signal to be transmitted. The signal current is superimposed on a bias current generated by the bias current source 21. A combination of the signal current and the bias current flows into the drive circuit 400.

As the signal current increases, the gate voltage of the transistor 420 rises so that a greater current flows from the voltage source 15 into the light emitting diode 111 via the transistor 420. As the current through the light emitting diode 111 increases, the intensity of the main light beam generated by the light emitting diode 111 increases. Thus, the phototransistor 413 in the receiver side is subjected to the main light beam having an increased intensity. As the intensity of the main light beam increases, a greater current caused by the voltage source 215 flows through the phototransistor 413, the source-drain path of the transistor 417, the output terminal 304, and the load 318. Thus, the current flowing through the output terminal 304 and the load 318 increases in accordance with an increase in the signal current.

As the signal current decreases, the gate voltage of the transistor 420 drops so that a smaller current flows from the voltage source 15 into the light emitting diode 111 via the transistor 420. As the current through the light emitting diode 111 decreases, the intensity of the main light beam generated by the light emitting diode 111 decreases. Thus, the phototransistor 413 in the receiver side is subjected to the main light beam having a decreased intensity. As the intensity of the main light beam decreases, a smaller current caused by the voltage source 215 flows through the phototransistor 413, the source-drain path of the transistor 417, the output terminal 304, and the load 318. Thus, the current flowing through the output terminal 304 and the load 318 decreases in accordance with a decrease in the signal current.

As previously described, the current through the output terminal 304 in the receiver side increases and decreases in accordance with an increase and a decrease in the signal current in the transmitter side. Thus, in the transmission apparatus of FIG. 5, the signal current is transmitted from the transmitter side to the receiver side. The ground 1 of the transmitter side and the ground 2 of the receiver side are isolated from each other. The power sources in the transmitter side and the power sources in the receiver side are separate from each other. Accordingly, the transmitter side and the receiver side are electrically isolated from each other.

It is now assumed that the characteristics of the light emitting diode 111 vary and hence the optical power output thereof decreases in accordance with a change in the temperature or the age thereof. As the optical power output of the light emitting diode 111 decreases, the intensity of the sub light beam generated by the light emitting diode 111 decreases. Thus, the phototransistor 412 is subjected to the sub light beam having a decreased intensity. As the intensity of the sub light beam decreases, the current flowing through the phototransistor 412 decreases. The decrease in the current through the phototransistor 412 causes an increase in the gate voltage of the transistor 420 and also an increase in the current through the light emitting diode 111. As the current through the light emitting diode 111 increases, the optical power output of the light emitting diode 111 increases. Thus, it is possible to compensate for a decrease in the optical power output of the light emitting diode 111 due to a change in the temperature or the age thereof.

It is now assumed that the characteristics of the light emitting diode 111 vary and hence the optical power output thereof increases in accordance with a change in the temperature thereof. As the optical power output of the light emitting diode 111 increases, the intensity of the sub light beam generated by the light emitting diode 111 increases. Thus, the phototransistor 412 is subjected to the sub light beam having an increased intensity. As the intensity of the sub light beam increases, the current flowing through the phototransistor 412 increases. The increase in the current through the phototransistor 112 causes a decrease in the gate voltage of the transistor 420 and also a decrease in the current through the light emitting diode 111. As the current through the light emitting diode 111 decreases, the optical power output of the light emitting diode 111 decreases. Thus, it is possible to compensate for an increase in the optical power output of the light emitting diode 111 due to a change in the temperature thereof.

In the transmission apparatus of FIG. 5, the combination of the transistors 421 and 422, the light emitting diode 323, and the current source 316 provides a bias voltage chosen to equalize the drain-source voltages of the phototransistors 412 and 413. Specifically, the drain-source voltage of the phototransistor 412 is equal to the sum of the normal-direction voltage across the light emitting diode 111 and the gate-source voltage of the transistor 420. The drain-source voltage of the phototransistor 413 is equal to the result of subtracting the gate-source voltage of the transistor 417 from the sum of the normal-direction voltage of the light emitting diode 323, the gate-source voltage of the transistor 421, and the gate-source voltage of the transistor 422.

The transmission apparatus of FIG. 5 has an advantage similar to the advantage of the transmission apparatus of FIG. 3.

Fifth Embodiment

Figure 6:
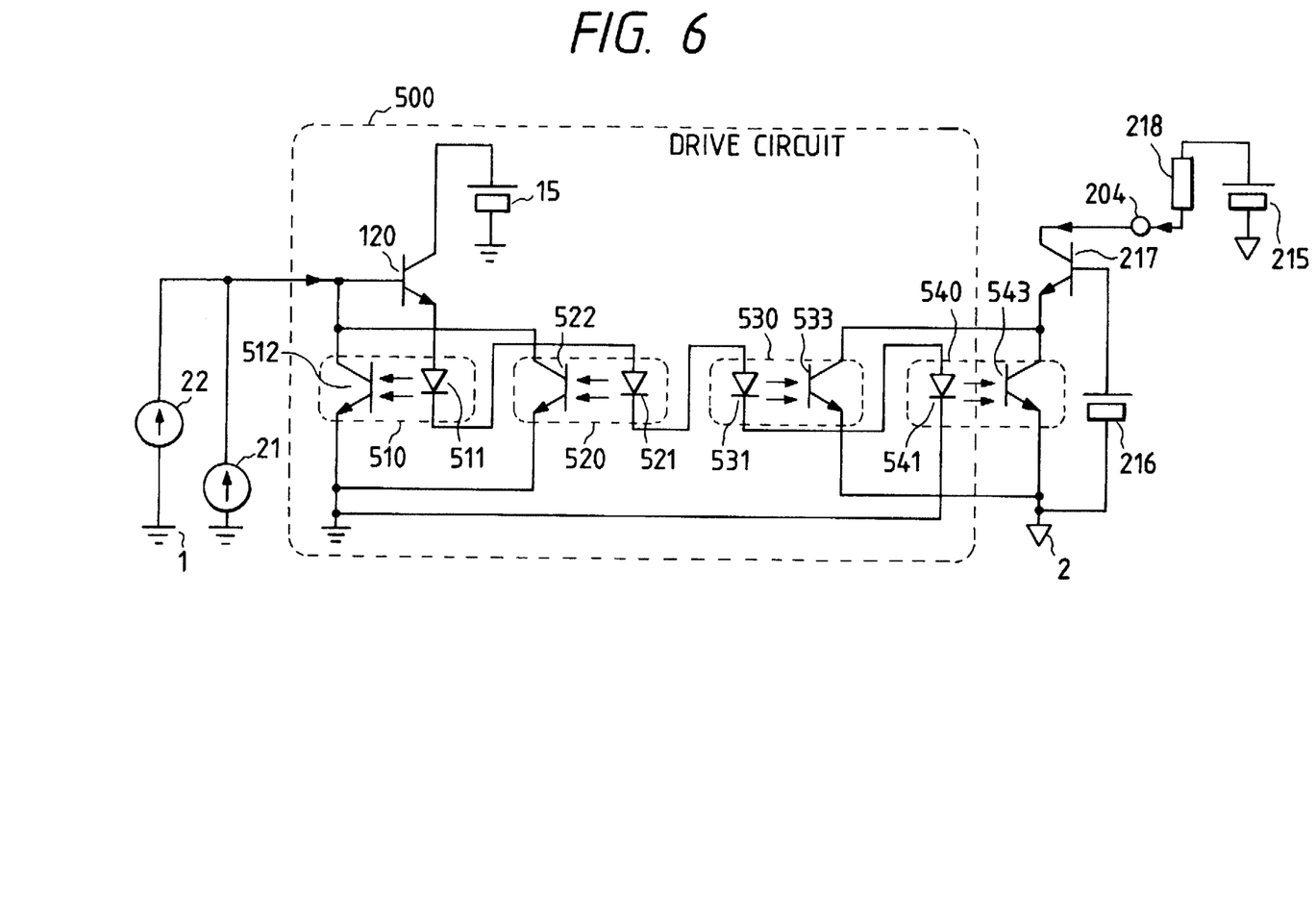
FIG. 6 is a diagram of an isolated signal transmission apparatus according to a fifth embodiment of this invention.

FIG. 6 shows an isolated signal transmission apparatus according to a fifth embodiment of this invention.

With reference to FIG. 6, a transmitter side of the transmission apparatus has a first ground 1, a bias current source 21, a signal current source 22, light emitting diodes 511, 521, 531, and 541, and a drive circuit 500 for the light emitting diodes 511, 521, 531, and 541.

The negative terminal of the bias current source 21 is connected to the first ground 1. The positive terminal of the bias current source 21 is connected to the drive circuit 500. The negative terminal of the signal current source 22 is connected to the first ground 1. The positive terminal of the signal current source 22 is connected to the drive circuit 500. The positive terminals of the bias current source 21 and the signal current source 22 are connected to each other. The drive circuit 500 is connected to the first ground 1. The light emitting diodes 511, 521, 531, and 541 are electrically connected to the drive circuit 500.

In the transmission apparatus of FIG. 6, the drive circuit 500 includes an NPN transistor 120 and a voltage source 15. The drive circuit 500 also includes portions of photocouplers 510, 520, 530, and 540. The photocoupler 510 has the light emitting diode 511 and an NPN phototransistor 512. The phototransistor 512 is optically coupled to the light emitting diode 511. The photocoupler 520 has the light emitting diode 521 and an NPN phototransistor 522. The phototransistor 522 is optically coupled to the light emitting diode 521. The photocoupler 530 has the light emitting diode 531 and an NPN phototransistor 533. The phototransistor 533 is optically coupled to the light emitting diode 531. The photocoupler 540 has the light emitting diode 541 and an NPN phototransistor 543. The phototransistor 543 is optically coupled to the light emitting diode 541. It is preferable that the photocouplers 510, 520, 530, and 540 are equal in characteristics.

The base of the transistor 120 is connected to the positive terminals of the bias current source 21 and the signal current source 22. The positive terminal of the voltage source 15 is connected to the collector of the transistor 120. The negative terminal of the voltage source 15 is connected to the first ground 1. The emitter of the transistor 120 is connected to the anode of the light emitting diode 511. The light emitting diodes 511, 521, 531, and 541 are connected in series or in cascade. The cathode of the light emitting diode 541 is connected to the first ground 1. Thus, the emitter of the transistor 120 is connected to the first ground 1 via the series combination of the light emitting diodes 511, 521, 531, and 541. The collectors of the phototransistors 512 and 522 are connected to the positive terminals of the bias current source 21 and the signal current source 22. The emitters of the phototransistors 512 and 522 are connected to the first ground 1.

A receiver side of the transmission apparatus of FIG. 6 includes a second ground 2, a bias voltage source 216, an NPN transistor 217, a load 218, a voltage source 215, and an output terminal 204. The receiver side also includes portions of the photo couplers 530 and 540. The ground 1 of the transmitter side and the ground 2 of the receiver side are isolated from each other.

The positive terminal of the bias voltage source 216 is connected to the base of the transistor 217. The negative terminal of the bias voltage source 216 is connected to the second ground 2. The emitter of the transistor 217 is connected to the collectors of the phototransistors 533 and 543. The emitters of the phototransistors 533 and 543 are connected to the second ground 2. The collector of the transistor 217 is connected to the positive terminal of the voltage source 215 via the output terminal 204 and the load 218. The negative terminal of the voltage source 215 is connected to the second ground 2.

The transmission apparatus of FIG. 6 operates as follows. The signal current source 22 generates a current (a signal current) being a signal to be transmitted. The signal current is superimposed on a bias current generated by the bias current source 21. A combination of the signal current and the bias current flows into the drive circuit 500.

As the signal current increases, the base current of the transistor 120 increases so that a greater current caused by the voltage source 15 flows through the collector-emitter path of the transistor 120 and the light emitting diodes 511, 521, 531, and 541. As the current through the light emitting diodes 531 and 541 increases, the intensities of light beams generated by the light emitting diodes 531 and 541 increase. Thus, the phototransistors 533 and 543 in the receiver side are subjected to the light beams having increased intensities. As the Intensities of the light beams increase, a greater current flows from the voltage source 215 into the phototransistors 533 and 543 via the load 218, the output terminal 204, and the transistor 217. Thus, the current flowing through the load 218 and the output terminal 204 increases in accordance with an increase in the signal current.

As the signal current decreases, the base current of the transistor 120 decreases so that a smaller current caused by the voltage source 15 flows through the collector-emitter path of the transistor 120 and the light emitting diodes 511, 521, 531, and 541. As the current through the light emitting diodes 531 and 541 decreases, the intensities of light beams generated by the light emitting diodes 531 and 541 decrease. Thus, the phototransistors 533 and 543 in the receiver side are subjected to the light beams having decreased intensities. As the intensifies of the light beams decrease, a smaller current flows from the voltage source 215 into the phototransistors 533 and 543 via the load 218, the output terminal 204, and the transistor 217. Thus, the current flowing through the load 218 and the output terminal 204 decreases in accordance with a decrease in the signal current.

As previously described, the current through the output terminal 204 in the receiver side increases and decreases in accordance with an increase and a decrease in the signal current in the transmitter side. Thus, in the transmission apparatus of FIG. 6, the signal current is transmitted from the transmitter side to the receiver side. The ground 1 of the transmitter side and the ground 2 of the receiver side are isolated from each other. The power sources in the transmitter side and the power sources in the receiver side are separate from each other. Accordingly, the transmitter side and the receiver side are electrically isolated from each other.

It is now assumed that the characteristics of each of the light emitting diodes 511, 521, 531, and 541 vary and hence the optical power output thereof decreases in accordance with a change in the temperature or the age thereof. As the optical power output of each of the light emitting diodes 511, 521, 531, and 541 decreases, the intensity of a light beam generated by the light emitting diode decreases. Thus, the phototransistors 512 and 522 are subjected to light beams having decreased intensities. As the intensities of the light beams decrease, the currents flowing through the phototransistors 512 and 522 decrease. The decrease in the current through each of the phototransistors 512 and 522 causes an increase in the base current of the transistor 120 and also an increase in the current through the light emitting diodes 511, 521, 531, and 541. As the current through each of the light emitting diodes 511, 521, 531, and 541 increases, the optical power output of the light emitting diode increases. Thus, it is possible to compensate for a decrease in the optical power output of each of the light emitting diodes 511, 521, 531, and 541 due to a change in the temperature or the age thereof.

It is now assumed that the characteristics of each of the light emitting diodes 511, 521, 531, and 541 vary and hence the optical power output thereof increases in accordance with a change in the temperature thereof. As the optical power output of each of the light emitting diodes 511, 521, 531, and 541 increases, the intensity of a light beam generated by the light emitting diode increases. Thus, the phototransistors 512 and 522 are subjected to light beams having increased intensities. As the intensities of the light beams increase, the currents flowing through the phototransistors 512 and 522 increase. The increase in the current through each of the phototransistors 512 and 522 causes a decrease in the base current of the transistor 120 and also a decrease in the current through the light emitting diodes 511, 521, 531, and 541. As the current through each of the light emitting diodes 511, 521, 531, and 541 decreases, the optical power output of the light emitting diode decreases. Thus, it is possible to compensate for an increase in the optical power output of each of the light emitting diodes 511, 521, 531, and 541 due to a change in the temperature thereof.

In the transmission apparatus of FIG. 6, the bias voltage source 216 is designed to equalize the collector-emitter voltages of the phototransistors 512, 522, 533, and 543.

The transmission apparatus of FIG. 6 has an advantage similar to the advantage of the transmission apparatus of FIG. 3.

Other Embodiments

In the first, second, third, and fifth embodiments, the NPN phototransistors may be replaced by PNP phototransistors or photodiodes.

In the first, second, third, fourth, and fifth embodiments, the light emitting diode (diodes) may be replaced by a laser diode (diodes).

In the fifth embodiment, the photocouplers 510, 520, 530, and 540 may be replaced by more than four photocouplers.

What is claimed is:

1. A driver for a light emitting device outputting a light beam having an intensity which increases as a drive current through the light emitting device increases, the driver comprising:

a power source for supplying a drive current to the light emitting device;

a control device connected to the power source and a first end of the light emitting device for controlling the drive current to the light emitting device in response to an input signal, the control device having an input terminal subjected to the input signal; and a photosensitive device optically coupled to the light emitting device, wherein a current flowing through the photosensitive device increases as an intensity of a light beam applied to the photosensitive device increases, the photosensitive device being connected between the input terminal of the control device and a second end of the light emitting device.

2. A driver as recited in claim 1, wherein the control device comprises an emitter follower including a transistor.

3. A driver as recited in claim 1, wherein the control device comprises a source follower including a MOS transistor.

4. A driver as recited in claim 1, further comprising a cascade transistor connected to the photosensitive device.

5. An isolated signal transmission apparatus comprising:

a light emitting device for outputting a light beam having an intensity which increases as a drive current through the light emitting device increases;

a power source for supplying a drive current to the light emitting device;

a control device connected to the power source and a first end of the light emitting device for controlling the drive current to the light emitting device in response to an input signal, the control device having an input terminal subjected to the input signal;

a first photosensitive device optically coupled to the light emitting device, wherein a current flowing through the first photosensitive device increases as an intensity of a light beam applied to the first photosensitive device increases, the first photosensitive device being connected between the input terminal of the control device and a second end of the light emitting device; and a second photosensitive device optically coupled to the light emitting device, wherein a current flowing through the second photosensitive device increases as an intensity of a light beam applied to the second photosensitive device increases.

6. An isolated signal transmission apparatus as recited in claim 5, wherein the control device comprises an emitter follower including a transistor.

7. An isolated signal transmission apparatus as recited in claim 5, wherein the control device comprises a source follower including a MOS transistor.

8. An isolated signal transmission apparatus as recited in claim 5, further comprising a cascade transistor connected to the second photosensitive device.

9. An isolated signal transmission apparatus as recited in claim 5, further comprising means for equalizing a voltage across the first photosensitive device and a voltage across the second photosensitive device.

10. An isolated signal transmission apparatus comprising:

a first light emitting device for outputting a light beam having an intensity which increases as a drive current through the first light emitting device increases;

a second light emitting device for outputting a light beam having an intensity which increases as a drive current through second first light emitting device increases, the second light emitting device being connected in series with the first light emitting device;

a power source for supplying a drive current to the series combination of the first and second light emitting devices;

a control device connected to the power source and a first end of the series combination of the first and second light emitting devices for controlling the drive current to the series combination of the first and second light emitting devices in response to an input signal, the control device having an input terminal subjected to the input signal;

a first photosensitive device optically coupled to the first light emitting device, wherein a current flowing through the first photosensitive device increases as an intensity of a light beam applied to the first photosensitive device increases, the first photosensitive device being connected between the input terminal of the control device and a second end of the series combination of the first and second light emitting devices; and a second photosensitive device optically coupled to the second light emitting device, wherein a current flowing through the second photosensitive device increases as an intensity of a light beam applied to the second photosensitive device increases.

11. An isolated signal transmission apparatus as recited in claim 10, wherein the control device comprises an emitter follower including a transistor.

12. An isolated signal transmission apparatus as recited in claim 10, wherein the control device comprises a source follower including a MOS transistor.

13. An isolated signal transmission apparatus as retired in claim 10, further comprising a cascade transistor connected to the second photosensitive device.

14. An isolated signal transmission apparatus as recited in claim 10, further comprising means for equalizing a voltage across the first photosensitive device and a voltage across the second photosensitive device.

* * * * *